US008730144B2

(12) United States Patent
Lee et al.

(10) Patent No.: US 8,730,144 B2
(45) Date of Patent: May 20, 2014

(54) DRIVING CIRCUIT FOR DISPLAY APPARATUS

(75) Inventors: Chang Ho Lee, Seoul (KR); Jaehoon Lee, Seoul (KR)

(73) Assignee: Samsung Display Co., Ltd., Yongin, Gyeonggi-Do (KR)

( * ) Notice: Subject to any disclaimer, the term of this patent is extended or adjusted under 35 U.S.C. 154(b) by 548 days.

(21) Appl. No.: 12/982,473

(22) Filed: Dec. 30, 2010

(65) Prior Publication Data

US 2011/0316834 A1    Dec. 29, 2011

(30) Foreign Application Priority Data

Jun. 24, 2010  (KR) .................. 10-2010-0060170

(51) Int. Cl.
*G09G 3/36*    (2006.01)

(52) U.S. Cl.
USPC .............................. 345/100; 345/98; 377/69

(58) Field of Classification Search
USPC .............................. 345/211, 100, 98; 377/69
See application file for complete search history.

(56) References Cited

U.S. PATENT DOCUMENTS

| 5,517,642 | A | 5/1996 | Bezek et al. | |
|---|---|---|---|---|
| 2003/0227433 | A1* | 12/2003 | Moon | 345/100 |
| 2006/0221042 | A1* | 10/2006 | Cho et al. | 345/100 |
| 2007/0296681 | A1* | 12/2007 | Kim et al. | 345/100 |
| 2010/0158187 | A1* | 6/2010 | Moon et al. | 377/76 |
| 2010/0226473 | A1* | 9/2010 | Liu et al. | 377/79 |

FOREIGN PATENT DOCUMENTS

KR    1020050079718 A    8/2005

* cited by examiner

*Primary Examiner* — Sumati Lefkowitz
*Assistant Examiner* — Jose Soto Lopez
(74) *Attorney, Agent, or Firm* — F. Chau & Associates, LLC

(57) ABSTRACT

A driving circuit includes a plurality of stages driven in response to a start signal. Each normal stage outputs a gate signal and a carry signal, increases an electric potential of a node in response to a previous carry signal of a previous stage, and decreases the gate signal to a first voltage in response to a carry signal from a next stage. Each stage applies a second voltage lower than the first voltage to the node in response to receipt of a carry signal from a second next stage. A first dummy stage outputs a first dummy carry signal to the last two normal stages in response to a last carry signal from the last normal stage and the start signal, and a second dummy stage outputs a second dummy carry signal to the last normal stage in response to the first dummy carry signal and the start signal.

20 Claims, 12 Drawing Sheets

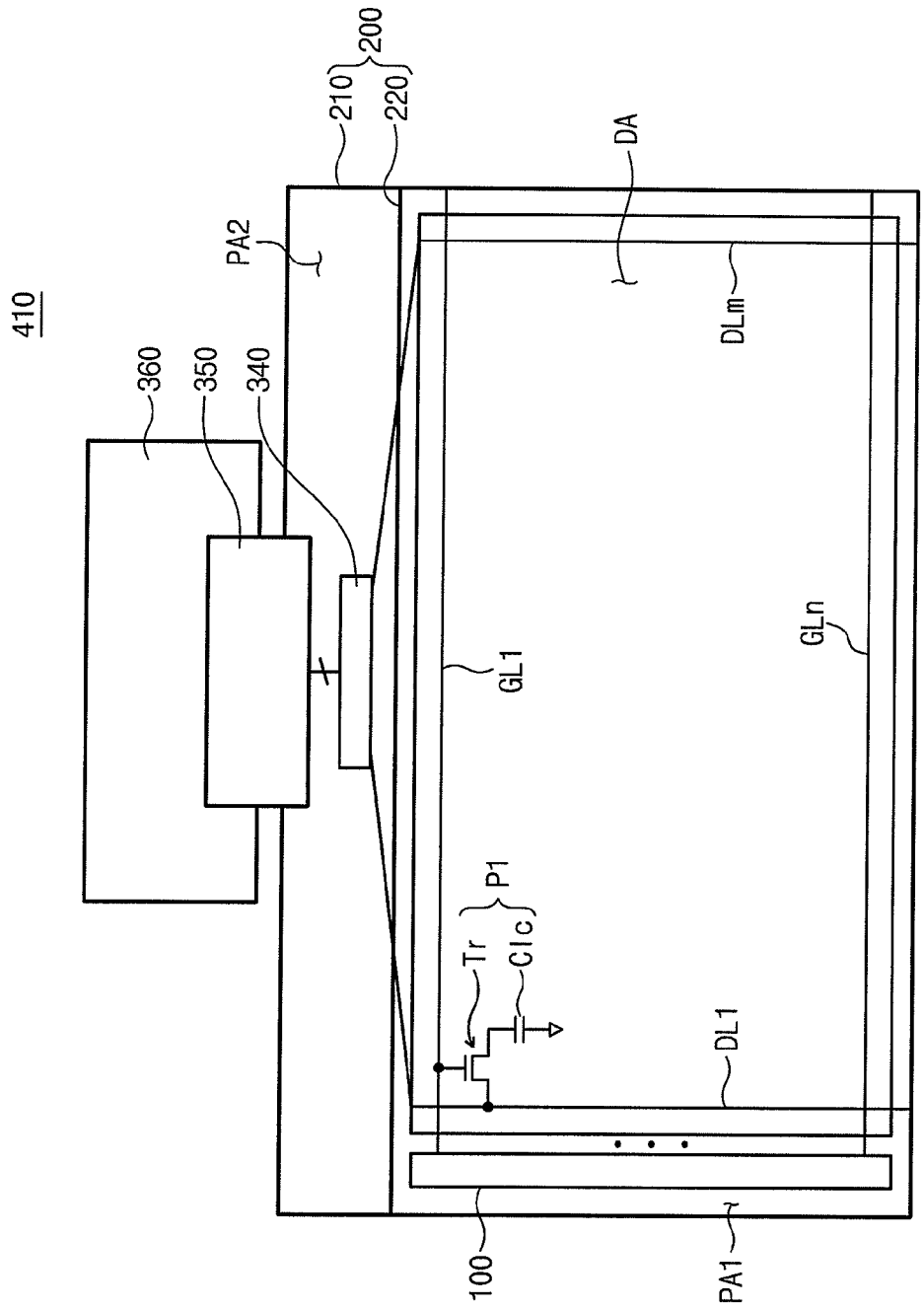

DRIVING CIRCUIT FOR DISPLAY APPARATUS

CROSS-REFERENCE TO RELATED APPLICATION

This application claims priority to Korean Patent Application No. 2010-60170, filed on Jun. 24, 2010, the disclosure of which is incorporated by reference in its entirety herein.

BACKGROUND

1. Technical Field

Embodiments of the present invention relate to a driving circuit for a display apparatus.

2. Discussion of Related Art

A liquid crystal display include a liquid crystal display panel including a lower substrate, an upper substrate facing the lower substrate, and a liquid crystal layer disposed between the lower substrate and the upper substrate.

The liquid crystal display panel further includes a plurality of gate lines, a plurality of data lines, and a plurality of pixels each connected to a corresponding gate line of the plurality of gate lines and a corresponding data line of the plurality of data lines. The liquid crystal display panel is provided with a gate driving circuit to sequentially output gate signals to the plurality of gate lines and a data driving circuit to output data signals to the plurality of data lines.

As an example, the liquid crystal display may employ a structure in which the gate driving circuit is directly formed on the liquid crystal display panel through a thin film process. In this example, the gate driving circuit includes a shift register in which a plurality of stages is connected to each other one after another. Each stage includes a plurality of transistors working together to output a gate voltage to the corresponding gate line. However, the gate driving circuit may malfunction due to a reduction of a threshold voltage of the transistors, which may be caused by exposure to excessively high temperatures.

SUMMARY

At least one exemplary embodiment of the present invention provides a driving circuit for a display apparatus that is capable of being stably operated under high ambient temperatures.

According to an exemplary embodiment of the present invention, a driving circuit includes a plurality of stages driven in response to a start signal. The stages include at least two normal stages, a first dummy stage, and a second stage. Each of the normal stages includes a first output part, a second output part, a control part, and a first holding part. The first output part outputs a gate signal according to an electric potential of a Q-node, and the second output part outputs a carry signal according to the electric potential of the Q-node. The control part increases the electric potential of the Q-node in response to a previous carry signal output from a previous one of the stages and decreases the gate signal to a first voltage in response to a first next carry signal output from a first next one of the stages. The first holding part receives a second next carry signal output from a second next one of the stages and applies a second voltage lower than the first voltage to the Q-node.

The first dummy stage applies a first dummy carry signal to the last two normal stages in response to a last carry signal from the last normal stage and the start signal. The first dummy carry signal output to the last normal stage may be a first next carry signal and the first dummy carry signal output to the next to last normal stage may be a second next carry signal. The second dummy stage outputs a second dummy carry signal to the last normal stage in response to the first dummy carry signal and the start signal. The second dummy carry signal output to the last normal stage may be a second next carry signal.

The first and second dummy stages are controlled by the start signal, so the driving circuit may normally output the first and second dummy carry signals under high ambient temperatures. The first and second dummy stages respectively discharge the first and second dummy carry signals by using the last carry signal of the last stage and the first dummy carry signal, which may reduce a ripple of the first and second dummy carry signals.

According to an exemplary embodiment of the present invention, a gate driving circuit for a display apparatus includes at least two normal stages, a first dummy stage, and a second dummy stage. Each stage outputs a carry signal to a next one of the stages. The first dummy stage receives a last carry signal from the last normal stage to generate a first dummy carry signal. The second dummy stage receives the first dummy carry signal from the first dummy stage to generate a second dummy carry signal. The last normal stage receives the first dummy carry signal from the first dummy stage and the second carry signal from the second dummy stage to generate a last carry signal. Each of the normal stages outputs a gate signal that is decreased to a first voltage in response to a first next carry signal output from a first next one of the stages, and applies a second voltage lower than the first voltage to a node therein in response to a second next carry signal output from a second next one of the stages.

According to an exemplary embodiment of the present invention, a gate driving circuit for a display apparatus includes a plurality of stages driven in response to a start signal. The stages include at least two normal stages, a first dummy stage, and a second dummy stage. Each normal stage includes a control part and a holding part. The control part increases an electric potential of a node within the normal stage in response to a previous carry signal output from a previous one of the stages and decreases a gate signal output by the normal stage to a first voltage in response to a first next carry signal output from a first next one of the stages. The holding part receives a second next carry signal output from a second next one of the stages and applies a second voltage lower than the first voltage to the node. The first dummy stage applies a first dummy carry signal to the last two normal stages in response to a last carry signal from the last normal stage and the start signal. The second dummy stage outputs a second dummy carry signal to the last normal stage in response to the first dummy carry signal and the start signal.

BRIEF DESCRIPTION OF THE DRAWINGS

Embodiments of the present invention will become readily apparent by reference to the following detailed description when considered in conjunction with the accompanying drawings wherein:

FIG. 13 is a plan view showing a display apparatus according to another exemplary embodiment of the present invention.

DETAILED DESCRIPTION OF EXEMPLARY EMBODIMENTS

It will be understood that when an element or layer is referred to as being "on", "connected to" or "coupled to" another element or layer, it can be directly on, connected or coupled to the other element or layer or intervening elements or layers may be present. Like numbers refer to like elements throughout.

Figure 1A:
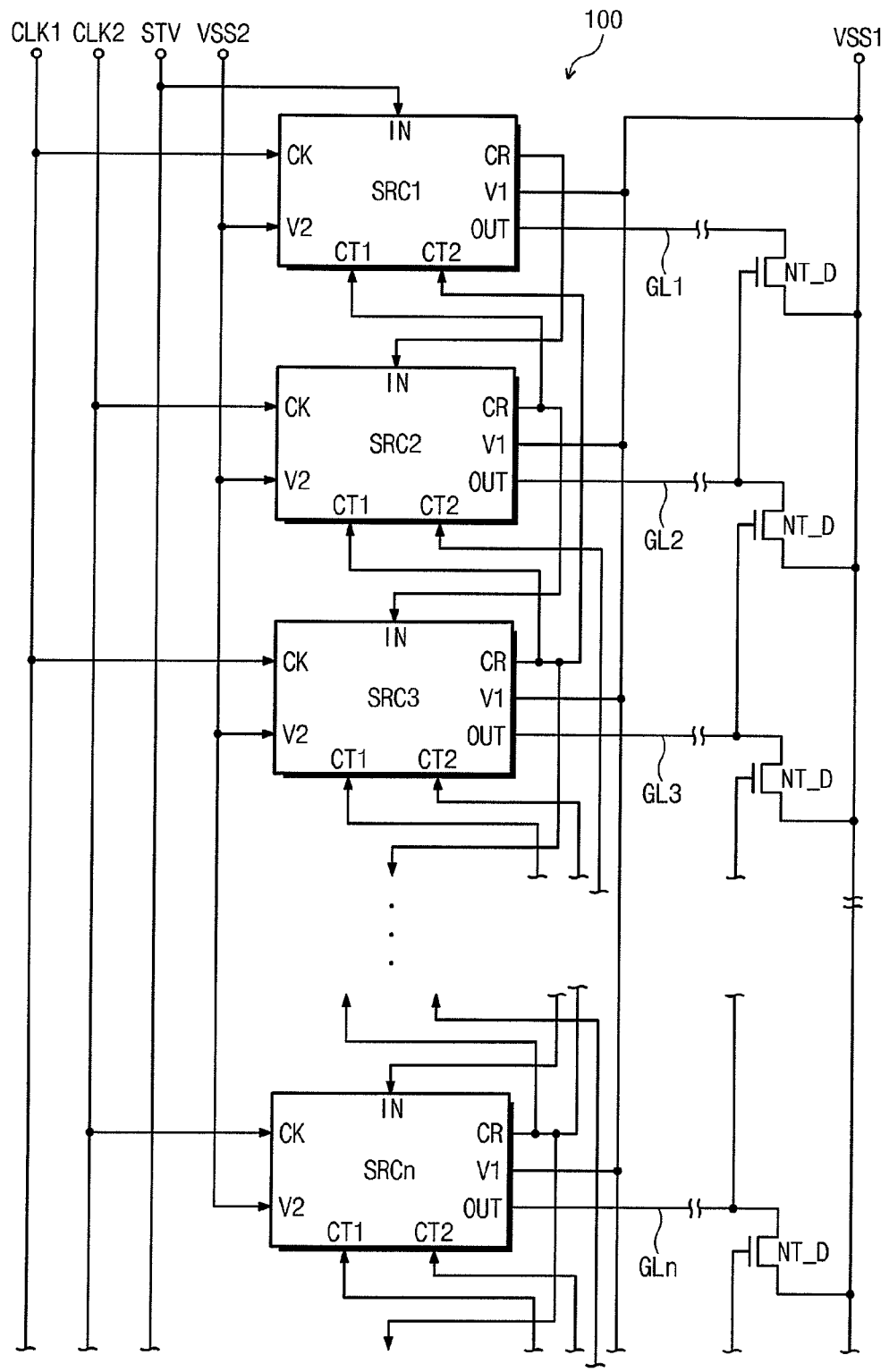
FIGS. 1A and 1B are block diagrams showing a gate driving circuit according to an exemplary embodiment of the present invention.
Figure 1B:
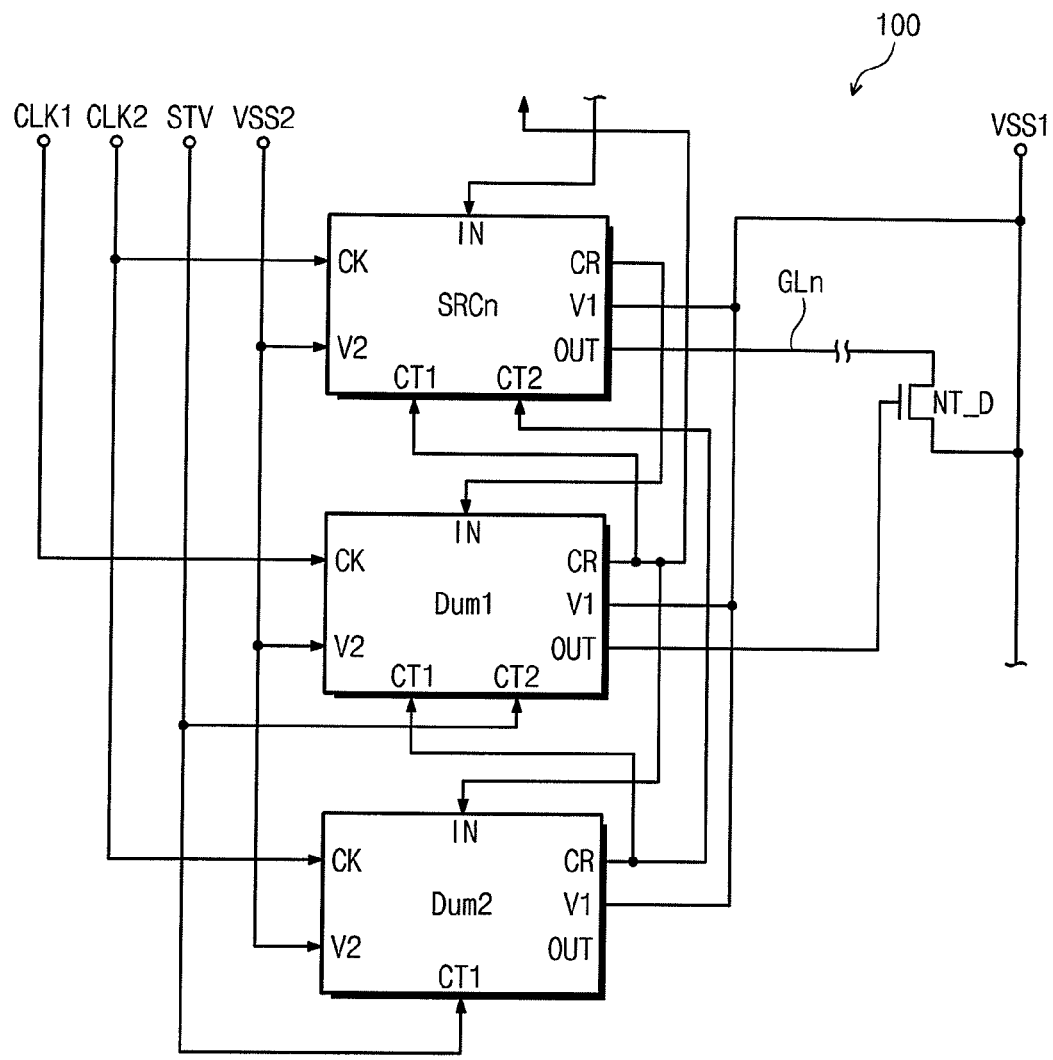

Hereinafter, exemplary embodiments of the present invention will be explained in detail with reference to the accompanying drawings. FIGS. 1A and 1B are block diagrams showing a gate driving circuit according to an exemplary embodiment of the present invention.

Referring to FIG. 1A, a gate driving circuit 100 includes a shift register including a plurality of stages SRC1 to SRCn connected to each other one after another. In at least one exemplary embodiment, "n" is a number equal to or larger than 2. The stages SRC1 to SRCn are connected to first ends of a plurality of gate lines GL1 to GLn in a one-to-one correspondence and each stage applies a gate signal to a corresponding gate line of the gate lines GL1 to GLn.

Each of the stages SRC1 to SCn includes an input terminal IN, a clock terminal CK, a first voltage input terminal V1, a second voltage input terminal V2, a first control terminal CT1, a second control terminal CT2, an output terminal OUT, and a carry terminal CR.

The input terminal IN of the stages SRC2 to SRCn beyond the first stage SRC1 are electrically connected to the carry terminal CR of a first previous stage, thereby receiving a previous carry signal. The input terminal IN of the first stage SRC1 receives a start signal STV that starts an operation of the gate driving circuit 100.

The first control terminal CT1 of each of the stages SRC1 to SRCn is electrically connected to the carry terminal CR of a first next stage, thereby receiving a first next carry signal. The second control terminal CT2 is electrically connected to the carry ten final CR of a second next stage, thereby receiving a second next carry signal. Exemplary signals applied to the first and second control terminals CT1 and CT2 of the N-th stage SRCn among the stages SRC1 to SRCn will be described with reference to FIG. 1B.

A first clock signal CLK1 is applied to the clock terminal CK of odd-numbered stages (e.g., SRC1 and SRC3) among the stages SRC1 to SRCn and a second clock signal CLK2 is applied to the clock terminal CK of even-numbered stages (e.g., SRC2) among the stages SRC1 to SRCn. The first clock signal CLK1 has a phase different from a phase of the second clock signal CLK2. As an example, the first clock signal CLK1 may have a phase opposite to the phase of the second clock signal CLK2.

Each of the stages SRC1 to SRCn receives a first voltage VSS1 through the first voltage input terminal V1 thereof and receives a second voltage VSS2 having a voltage level lower than the first voltage VSS1 through its the second voltage input terminal V2. The first voltage VSS1 may be a ground or a negative voltage. For example, the first voltage VSS1 may be about −6 volts and the second voltage VSS2 may be about −12 volts.

The output terminal OUT of each of the stages SRC1 to SRCn is connected with a corresponding gate line of the gate lines GL1 to GLn. Accordingly, the gate signal output through the output terminal OUT may be applied to the corresponding gate line.

The carry terminal CR of each of the stages SRC1 to SRCn is electrically connected to the input terminal IN of the first next stage. The carry terminal CR of each of the stages SRC2 to SRCn is electrically connected to the first control terminal CT1 of the first previous stage. The carry terminal CR of each of the stages SRC3 to SRCn is electrically connected to the second control terminal CT2 of a second previous stage that is one of the previous stages of the first previous stage.

A plurality of discharge transistors NT_D are connected to second ends of the gate lines GL1 to GLn, respectively. Each of the discharge transistors NT_D includes a control electrode connected to a next gate line of a corresponding gate line, an input electrode receiving the first voltage VSS1, and an output electrode connected to the corresponding gate line. Thus, each of the discharge transistors NT_D discharges the gate signal of the corresponding gate line in response to the next gate signal applied to the next gate line.

Referring to FIG. 1B, the gate driving circuit 100 further includes a first dummy stage Dum1 and a second dummy stage Dum2 in addition to the stages SRC1 to SRCn.

The first dummy stage Dum1 includes an input terminal IN, a clock terminal CK, first and second voltage input terminals V1 and V2, first and second control terminals CT1 and CT2, an output terminal OUT, and a carry terminal CR.

The first dummy stage Dum1 receives the carry signal from the N-th stage SRCn through its input terminal IN and outputs a first dummy carry signal Cr(dum1) through the carry terminal CR and the output terminal OUT thereof in response to the N-th stage SRCn.

The carry terminal CR of the first dummy stage Dum1 is connected with the first control terminal CT1 of the N-th stage SRCn and the input terminal IN of the second dummy stage Dum2 to apply the first dummy carry signal Cr(dum1) to the first control terminal CT1 of the N-th stage SRCn and the input terminal IN of the second dummy stage Dum2. Although not shown in FIG. 1, the carry terminal CR of the first dummy stage Dum1 is connected with the second control terminal CT2 of an (N−1)-th stage SRCn−1 among the stages SRC1 to SRCn to apply the first dummy carry signal Cr(dum1) to the second control terminal CT2 of an (N−1)-th stage SRCn−1.

In addition, the output terminal of the first dummy stage Dum1 is connected with the control electrode of the discharge transistor NT_D connected with the last gate line GLn among the gate lines GL1 to GLn. Accordingly, the last discharge transistor NT_D is turned on in response to the first dummy carry signal Cr(dum1) output through the output terminal OUT of the first dummy stage Dum1, and the turned-on discharge transistor NT_D lowers the electric potential of the last gate line GLn to the first voltage VSS1.

The second dummy stage Dum2 includes an input terminal IN, a clock terminal CK, first and second voltage input terminals V1 and V2, a first control terminal CT1, an output terminal OUT, and a carry terminal CR.

The second dummy stage Dum2 receives the first dummy carry signal Cr(dum1) from the first dummy stage Dum1 through its input terminal IN and outputs the second dummy carry signal Cr(dum2) through the carry terminal CR and the output terminal OUT thereof in response to the first dummy carry signal Cr(dum1).

The carry terminal CR of the second dummy stage Dum2 is connected with the second control terminal CT2 of the N-th stage SRCn (e.g., a last normal stage) and the first control terminal CT1 of the first dummy stage Dum1 to apply the second dummy carry signal Cr(dum2) to the second control terminal CT2 of the N-th stage SRCn and the first control terminal CT1 of the first dummy stage Dum1.

Thus, the first and second control terminals CT1 and CT2 of the N-th stage SRCn may receive the first and second dummy carry signals Cr(dum1) and Cr(dum2) from the first and second dummy stages Dum1 and Dum2. As a result, the N-th stage SRCn may be normally operated by the first and second dummy stages Dum1 and Dum2.

As shown in FIG. 1B, the first dummy stage Dum1 receives the start signal STV through its second control terminal CT2, which is applied to the input terminal IN of the first stage SRC1 among the stages SRC1 to SRCn. In addition, the start signal STV may be applied to the first control terminal CT1 of the second dummy stage Dum2. Different from the first dummy stage Dum1, the second dummy stage Dum2 does not include the second control terminal CT2.

Figure 2:
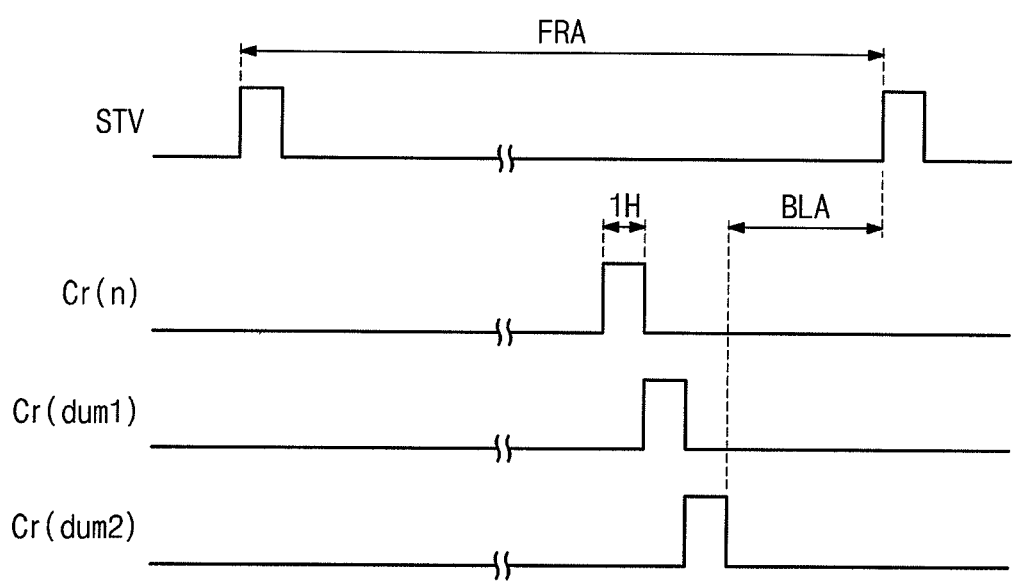
FIG. 2 is an exemplary waveform diagram of a start signal, a first dummy carry signal, and a second dummy carry signal shown in FIG. 1B.

FIG. 2 is an exemplary waveform diagram of a start signal, a first dummy carry signal, and a second dummy carry signal shown in FIG. 1B.

Referring to FIG. 2, the start signal STV is generated at a logic high state during one horizontal period (1H) period in every one frame period FRA. The one frame period FRA includes a blank period BLA during which the carry signals are not output from the gate driving circuit 100.

The first and second dummy carry signals Cr(dum1) and Cr(dum2) are sequentially generated and each of the first and second dummy carry signals Cr(dum1) and Cr(dum2) are maintained in the logic high state during 1H period.

The blank period BLA is defined from the point at which the second dummy carry signal Cr(dum2) transitions to a logic low state to the point at which the start signal STV transitions to the logic high state.

As described above with reference to FIG. 1B, the start signal STV is applied to the second control terminal CT2 of the first dummy stage Dum1 and the first control terminal CT1 of the second dummy stage Dum2.

As shown in FIG. 2, since the start signal STV indicates a start of a next frame, the start signal STV is generated at the logic high state after the point at which the second dummy carry signal Cr(dum2) transitions to the logic low state. Accordingly, the start signal STV may be used to control the first and second dummy stages Dum1 and Dum2.

Figure 3:
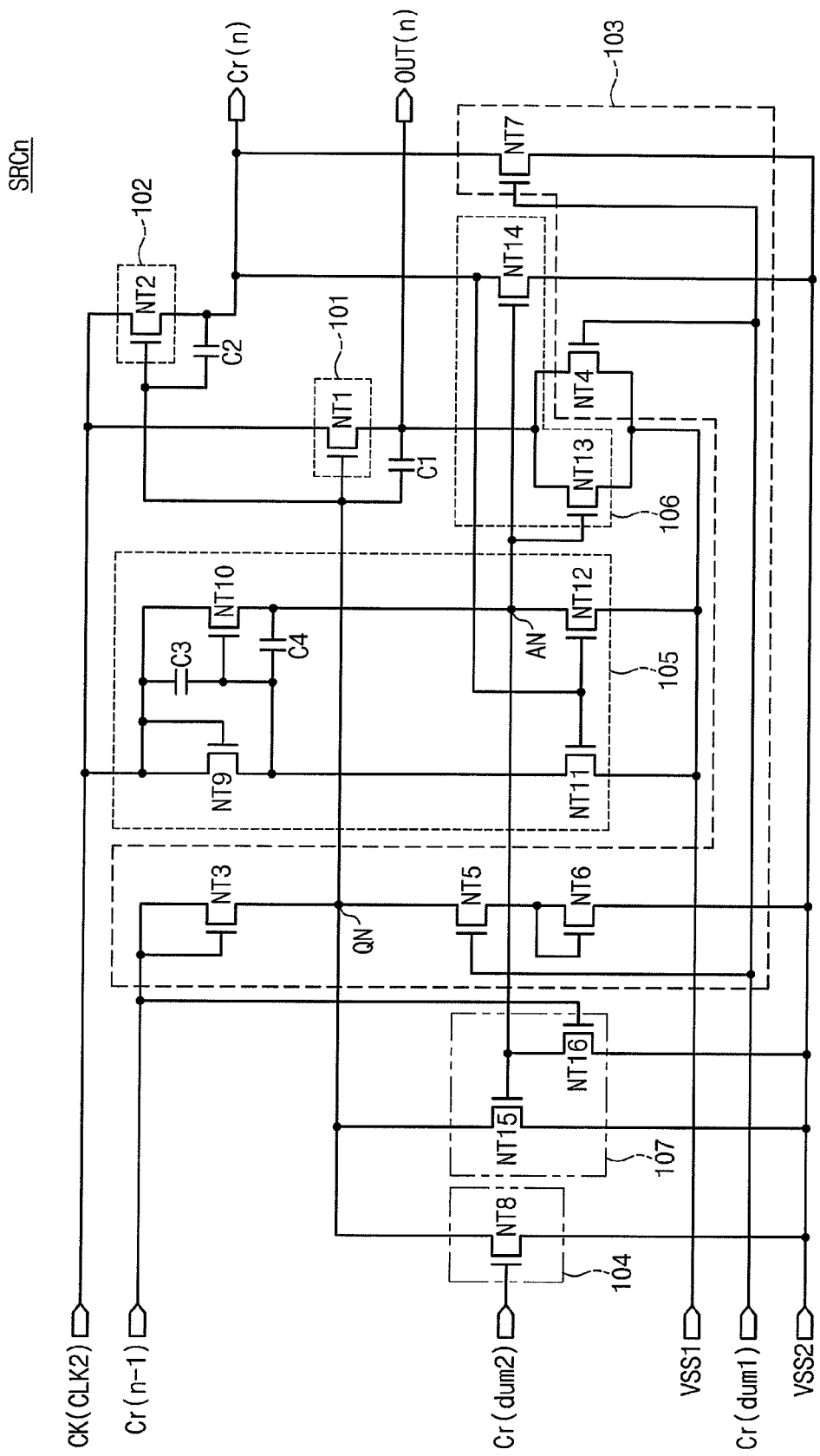
FIG. 3 is a circuit diagram showing an N-th stage of a plurality of stages shown in FIG. 1A according to an exemplary embodiment of the invention.

FIG. 3 is a circuit diagram showing an N-th stage of the plurality of stages shown in FIG. 1A. Since the stages SRC1 to SRCn have a similar structure except for the difference between the signals respectively applied to the stages SRC1 to SRCn, in FIG. 3, the N-th stage SRCn has been shown.

Referring to FIG. 3, the N-th stage SRCn includes a first output part 101, a second output part 102, a control part 103, a first holding part 104, an inverter part 105, a second holding part 106, and a stabilizing part 107.

The first output part 101 outputs a gate signal OUT(n) according to an electric potential of a Q-node QN and the second output part 102 outputs a carry signal Cr(n) according to the electric potential of the Q-node QN. The gate signal OUT(n) and the carry signal Cr(n) may have the same phase and amplitude.

The first output part 101 includes a first output transistor NT1 and the second output part 102 includes a second output transistor NT2. The first transistor NT1 includes an input electrode receiving the second clock signal CLK2, a control electrode connected to the Q-node QN, and an output electrode connected to the output terminal OUT. The second output transistor NT2 includes an input electrode receiving the second clock signal CLK2, a control electrode connected to the Q-node QN, and an output electrode connected to the carry terminal CR.

When the electric potential of the Q-node QN is increased above a threshold level, the first and second output transistors NT1 and NT2 are turned on to output the second clock signal CLK2 as the gate signal OUT(n) and the carry signal Cr(n), respectively.

The control part 103 increases the electric potential of the Q-node QN in response to a previous carry signal Cr(n−1) and decreases the gate signal OUT(n) to the first voltage VSS1 in response to a first next carry signal Cr(dum1) of the first next stage.

As an example, the control part 103 includes a buffer transistor NT3, first and second pull-down transistors NT4 and NT7, and first and second discharge transistors NT5 and NT6.

The buffer transistor NT3 includes an input electrode and a control electrode, which are commonly connected to the input terminal IN to receive the (N−1)-th carry signal Cr(n−1), and an output electrode connected to the Q-node QN. Thus, the buffer transistor NT3 may increase the electrode potential of the Q-node QN in response to the (N−1)-th carry signal Cr(n−1).

The first pull-down transistor NT4 includes an input electrode connected to the output terminal OUT to receive the gate signal OUT(n), a control electrode connected to the first control terminal CT1 to receive the first dummy carry signal Cr(dum1), and an output electrode connected to the first voltage input terminal V1. Accordingly, the first pull-down transistor NT4 may decrease the gate signal OUT(n) to the first voltage VSS1 in response to the first dummy carry signal Cr(dum1).

The first discharge transistor NT5 includes an input electrode connected to the Q-node QN, a control electrode connected to the first control terminal CT1 to receive the first dummy carry signal Cr(dum1), and an output electrode connected to the second discharge transistor NT6. The second discharge transistor NT6 includes an input electrode and a control electrode, which are commonly connected to the output electrode of the first discharge transistor NT5, and an output electrode connected to the second voltage input terminal V2 to which the second voltage VSS2 is applied. Thus, the first and second discharge transistors NT5 and NT6 may discharge the electric potential of the Q-node QN in response to the first dummy carry signal Cr(dum1).

The second pull-down transistor NT7 includes an input electrode connected to the carry terminal CR to receive the carry signal Cr(n), a control electrode connected to the first control terminal CT1 to receive the first dummy carry signal Cr(dum1), and an output electrode connected to the second voltage input terminal V2 to which the second voltage VSS2 is applied. Accordingly, the second pull-down transistor NT7 may decrease the carry signal Cr(n) to the second voltage VSS2 in response to the first dummy carry signal Cr(dum1).

The control part 103 further includes a first capacitor C1 and a second capacitor C2. The first capacitor C1 is connected between the control electrode and the output electrode of the first output transistor NT1 and the second capacitor C2 is connected between the control electrode and the output electrode of the second output transistor NT2.

When the buffer transistor NT3 is turned on in response to the previous carry signal Cr(n−1), the electric potential of the Q-node QN is increased, so the first and second output transistors NT1 and NT2 are turned on. When the electric potential of the output terminal OUT and the carry terminal CR is increased by the first and second output transistors NT1 and NT2, the electric potential of the Q-node QN is boosted up by the first and second capacitors C1 and C2. Accordingly, the first and second output transistors NT1 and NT2 may be maintained in the turned-on state by a bootstrapping operation caused by the boost up, and the gate signal OUT(n) and the carry signal Cr(n) may be generated in the logic high state during the high period of the second clock signal CLK2.

The first holding part 104 receives the second next carry signal Cr(dum2) and applies the second voltage VSS2 having a voltage level lower than the first voltage VSS1 to the Q-node QN. The first holding part 104 includes a first holding transistor NT8. The first holding transistor NT8 includes an input electrode connected to the Q-node QN, a control electrode connected to the second control terminal CT2 to receive the second dummy carry signal Cr(dum2), and an output electrode connected to the second voltage input terminal V2 to which the second voltage VSS2 is applied.

The inverter part 105 outputs the second clock signal CLK2 to an A-node AN in response to the carry signal Cr(n), and the second holding part 106 holds the gate signal OUT(n) and the carry signal Cr(n) at the first voltage VSS1 in response to the second clock signal CLK2 provided through the A-node AN.

The inverter part 105 includes a first transistor NT9, a second transistor NT10, a third transistor NT11, a twelfth transistor NT12, a third capacitor C3, and a fourth capacitor C4.

The first transistor NT9 includes an input electrode and a control electrode to commonly receive the second clock signal CLK2 and an output electrode connected to the third transistor NT11. The second transistor NT10 includes an input electrode receiving the second clock signal CLK2, a control electrode connected to the output electrode of the first transistor NT9, and an output electrode connected to the A-node AN. The third capacitor C3 is connected between the input electrode and the control electrode of the second transistor NT10 and the fourth capacitor C4 is connected between the control electrode and the output electrode of the second transistor NT10.

The third transistor NT11 includes an input electrode connected to the output electrode of the first transistor NT9, a control electrode connected to the carry terminal CR to receive the carry signal Cr(n), and an output electrode connected to the first voltage input terminal V1 to which the first voltage VSS1 is applied. The fourth transistor NT12 includes an input electrode connected to the A-node AN, a control electrode connected to the carry terminal CR to receive the carry signal CR(n), and an output electrode connected to the first voltage input terminal V1 to which the first voltage VSS1 is applied.

The second holding part 106 includes a second holding transistor NT13 and a third holding transistor NT14. The second holding transistor NT13 includes an input electrode connected to the output terminal OUT to receive the gate signal OUT(n), a control electrode receiving the second clock signal CLK2 through the A-node AN, and an output electrode connected to the first voltage input terminal V1. The third holding transistor NT14 includes an input electrode connected to the carry terminal CR to receive the carry signal Cr(n), a control electrode receiving the second clock signal CLK2 through the A-node AN, and an output electrode connected to the second voltage input terminal V2.

The third and fourth capacitors C3 and C4 are gradually charged by the second clock signal CLK2. Then, when the second transistor NT10 is turned on and the third and fourth transistors NT11 and NT12 are turned off by the charged voltage, the electric potential of the A-node AN is increased.

When the electric potential of the A-node AN is increased beyond a threshold level, the second and third holding transistors NT13 and NT14 are turned on. Due to the turned-on second and third holding transistors NT13 and NT14, the gate signal OUT(n) and the carry signal Cr(n) may be held at the first and second voltages VSS1 and VSS2, respectively.

Thus, the second holding part 106 may hold the gate signal OUT(n) at the first voltage VSS1 and the carry signal Cr(n) at the second voltage VSS2 in the turned-off period of the first output part 101.

As described above, the inverter part 105 of each stage may hold the electric potential of the A-node AN in the first voltage VSS1 in response to the carry signal Cr(n) output therefrom, thereby stabilizing the electric potential of the second node AN. Thus, the bootstrapping operation may be normally performed, so that a malfunction of the first and second output transistors NT1 and NT2 may be prevented during high ambient temperatures.

The stabilizing part 107 includes a first stabilizing transistor NT15 to stabilize the electric potential of the Q-node QN and a second stabilizing transistor NT16 to stabilize the electric potential of the A-node AN.

The first stabilizing transistor NT15 includes an input electrode connected to the Q-node QN, a control electrode connected to the A-node, and an output electrode connected to the second voltage input terminal V2. Accordingly, when the electric potential of the A-node AN is increased, the first stabilizing transistor NT15 is turned on by the electric potential of the A-node AN to hold the electric potential of the Q-node QN in the second voltage VSS2. In addition, the first stabilizing transistor NT15 may reduce a leakage current of the first output transistor NT1 and prevent the first output transistor NT1 from being erroneously turned on during high ambient temperatures.

The second stabilizing transistor NT16 includes an input electrode connected to the A-node AN, a control electrode connected to the input terminal IN to receive the previous carry signal Cr(n−1), and an output electrode connected to the second voltage input terminal V2. The second stabilizing transistor NT16 decreases the electric potential of the A-node AN to the second voltage VSS2 in response to the previous carry signal Cr(n−1). When the previous carry signal Cr(n−1) transitions to the logic high state, the electric potential of the A-node AN is lowered to the second voltage VSS2. As a result, the second and third holding transistors NT13 and NT14 may be changed to the turned-off state from the turned-on state.

Figure 4:
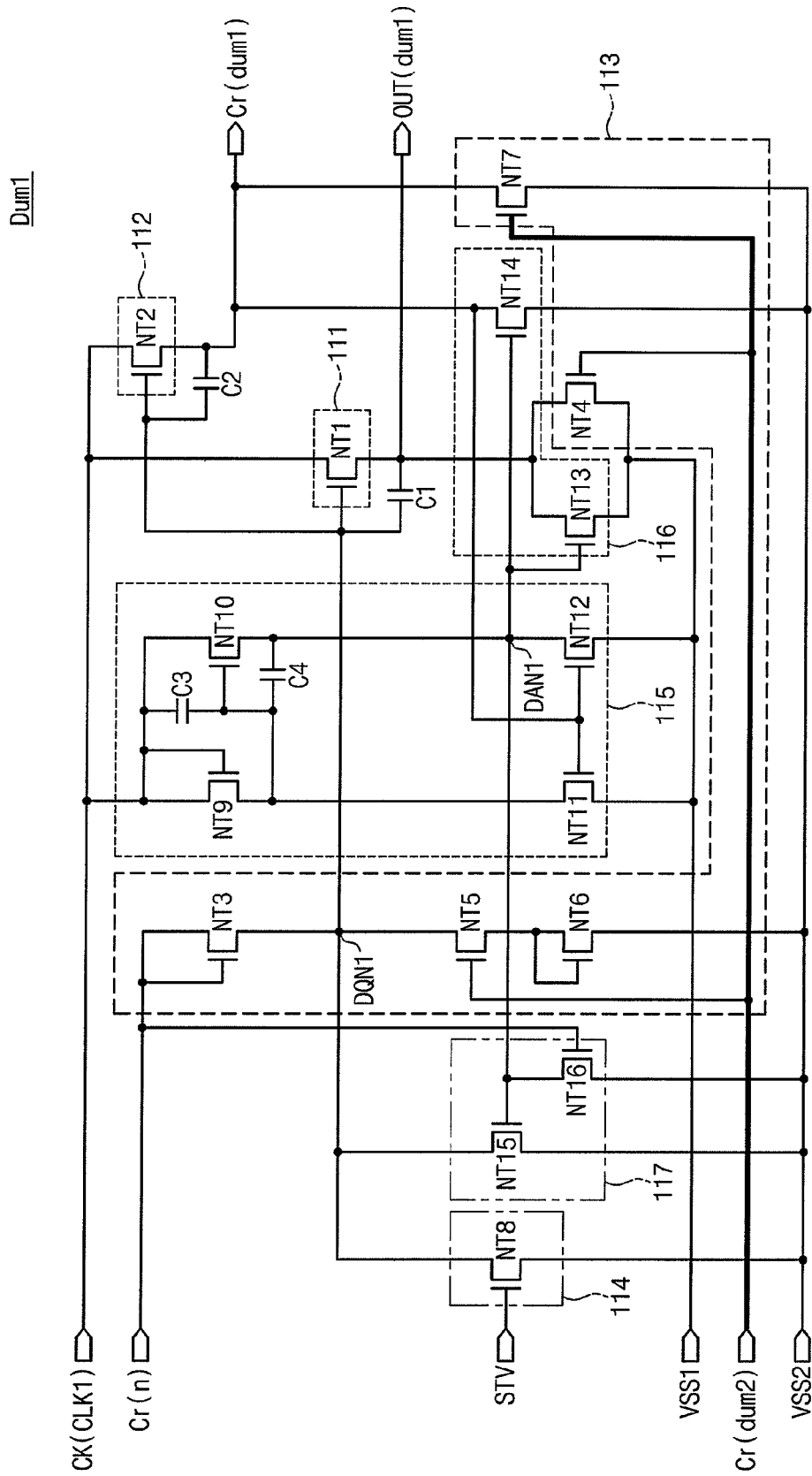
FIG. 4 is a circuit diagram showing a first dummy stage according to an exemplary embodiment of the present invention.

FIG. 4 is a circuit diagram showing a first dummy stage according to an exemplary embodiment of the present invention. Referring to FIG. 4, the first dummy stage Dum1 includes a third output part 111, a fourth output part 112, a first dummy control part 113, a first dummy holding part 114, a first dummy inverter part 115, a second dummy holding part 116, and a first dummy stabilizing part 117. The first dummy stage Dum1 has the same circuit configuration as that of each of the stages SRC1 to SRCn, and thus a detailed description of the circuit configuration of the first dummy stage Dum1 will be omitted.

The third output part 111 outputs the first dummy gate signal OUT(dum1) according to the electric potential of a first dummy Q-node DQN1 and the fourth output part 112 outputs the first dummy carry signal Cr(dum1) according to the electric potential of the first dummy Q-node DQN1. The first dummy carry signal Cr(dum1) is applied to the first control terminal CT1 of the N-th stage SRCn and the second control terminal CT2 of the (N−1)-th stage SRCn−1 among the stages SRC1 to SRCn.

The first dummy control part 113 increases the electric potential of the first dummy Q-node DQN1 in response to the previous carry signal Cr(n) and decreases the dummy gate signal OUT(dum1) to the first voltage VSS in response to the second dummy carry signal Cr(dum2) of the second dummy stage Dum (shown in FIG. 1B). Since the first dummy control part 113 has substantially the same circuit configuration as the control part 103 shown in FIG. 3, a detailed description of the circuit configuration of the first dummy control part 113 will be omitted.

The first dummy holding part 114 receives the start signal STV and applies the second voltage to the first dummy Q-node DQN1. When the start signal STV transitions to the logic high state after the start of a frame, the first dummy holding part 114 decreases the electric potential of the first dummy Q-node DQN1 to the second voltage VSS2.

The first dummy inverter part 115 outputs a first clock signal CLK1 to a first dummy A-node DAN1 in response to the first dummy carry signal Cr(dum1). For example, when the first dummy carry signal Cr(dum1) is in the logic high state, the first dummy inverter part 115 decreases the first dummy A-node DAN1 to the first voltage VSS1 and the first dummy inverter part 115 outputs the first clock signal CLK1 to the first dummy A-node DAN1.

When the first dummy carry signal Cr(dum1) is in the logic high state, the second dummy holding part 116 is turned off. When the first dummy carry signal Cr(dum1) transitions to the logic low state, the second dummy holding part 116 is turned on to hold the first dummy gate signal OUT(dum1) and the first dummy carry signal Cr(dum1) at the first voltage VSS1.

The first dummy stabilizing part 117 holds the electric potential of the first dummy Q-node DQN1 at the second voltage VSS2 according to the electric potential of the first dummy A-node DAN1 and holds the electric potential of the first dummy A-node DAN1 at the second voltage VSS2 in response to the N-th carry signal Cr(n).

As described above, the first dummy stage Dum1 has substantially the same circuit configuration as the N-th stage SRCn. However, in the present exemplary embodiment, the second dummy carry signal Cr(dum1) of the second dummy stage Dum2 is applied to the first control terminal CT1 of the first dummy stage Dum1, and the start signal STV is applied to the second control terminal CT2.

Accordingly, when the start signal STV is applied to the second control terminal CT2 of the first dummy stage Dum1, the electric potential of the first dummy Q-node DQN1 may be stably held at the second voltage VSS2.

Figure 5:
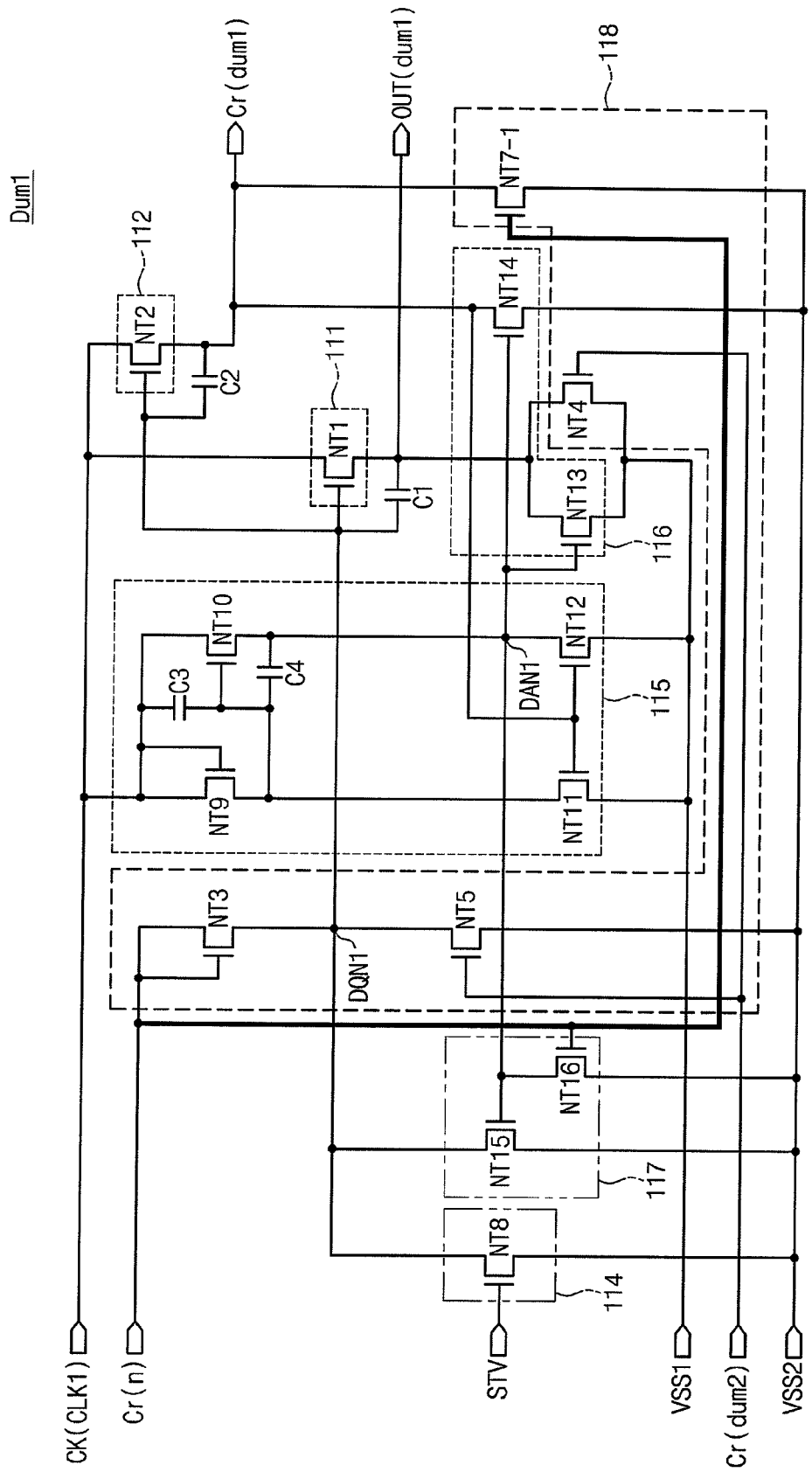
FIG. 5 is a circuit diagram showing a first dummy stage according to another exemplary embodiment of the present invention.

FIG. 5 is a circuit diagram showing a first dummy stage according to another exemplary embodiment of the present invention. In FIG. 5, the same reference numerals denote the same elements in FIG. 4, and thus detailed descriptions of the same elements will be omitted.

Referring to FIG. 5, a first dummy stage Dum1 includes a third output part 111, a fourth output part 112, a first dummy control part 118, a first dummy holding part 114, a first dummy inverter part 115, a second dummy holding part 116, and a first dummy stabilizing part 117.

The first dummy stage Dum1 has the same circuit configuration as the first dummy stage Dum1 except for the structure of the first dummy control part 118.

The first dummy control part 118 includes a buffer transistor NT3, a first pull-down transistor NT4, a second pull-down transistor NT7-1, and a first discharge transistor NT5.

The buffer transistor NT3 includes an input electrode and a control electrode that are commonly connected to the input terminal IN to receive the N-th carry signal Cr(n), and an output electrode connected to the Q-node DQN1. Accordingly, the buffer transistor NT3 may increase the electric potential of the Q-node DQN1 in response to the N-th carry signal Cr(n).

The first pull-down transistor NT4 includes an input electrode connected to the output terminal OUT to receive the dummy gate signal OUT(dum1), a control electrode connected to the first control terminal CT1 to receive the second dummy carry signal Cr(dum2), and an output electrode connected to the first voltage input terminal V1. Thus, the first pull-down transistor NT4 may decrease the dummy gate signal OUT(dum1) to the first voltage VSS1 in response to the second dummy carry signal Cr(dum2).

The first discharge transistor NT5 includes an input electrode connected to the Q-node DQN1, a control electrode connected to the first control terminal CT1 to receive the second dummy carry signal Cr(dum2), and an output electrode connected to the second voltage input terminal V2 to which the second voltage VSS2 is applied. Therefore, the first discharge transistor NT5 may discharge the electric potential of the Q-node DQN1 to the second voltage VSS2 in response to the second dummy carry signal Cr(dum2).

The second pull-down transistor NT7-1 includes an input electrode connected to the carry terminal CR to receive the first dummy carry signal Cr(dum1), a control electrode connected to the input terminal IN to receive the N-th carry signal Cr(n), and an output electrode connected to the second voltage input terminal V2 to which the second voltage VSS2 is applied. Accordingly, the second pull-down transistor NT7-1 may decrease the carry signal Cr(n) to the second voltage VSS2 in response to the N-th carry signal Cr(n).

Figure 6:
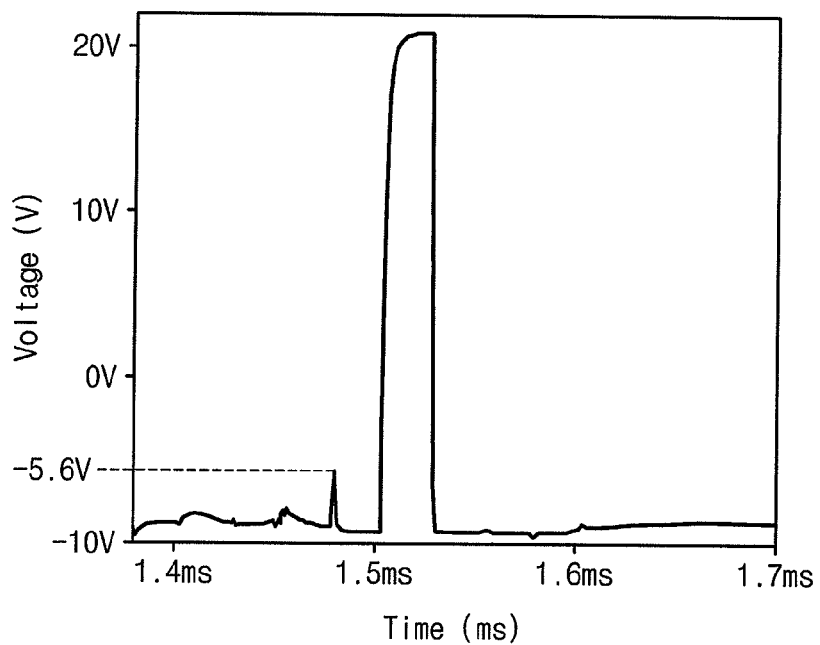
FIG. 6 is an exemplary waveform diagram of an output of a first dummy stage shown in FIG. 4.
Figure 7:
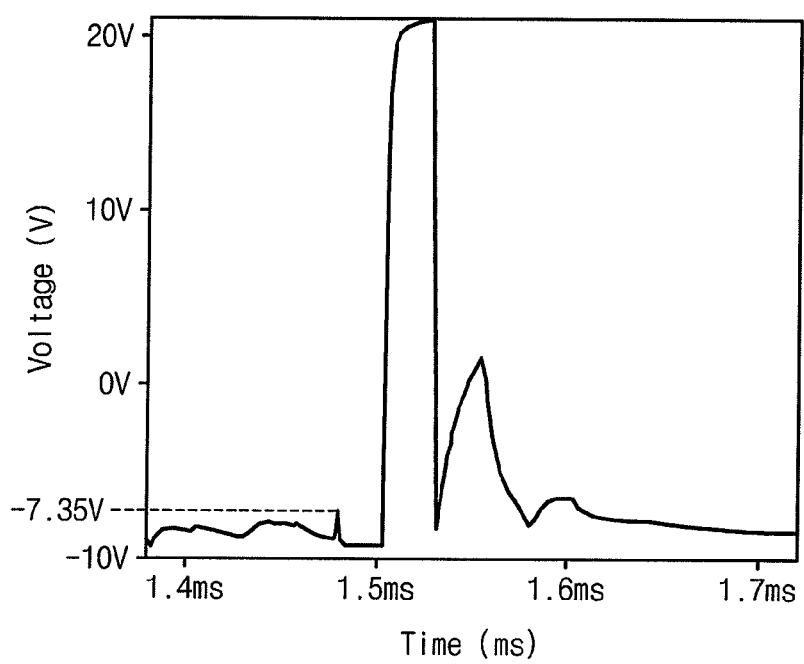
FIG. 7 is an exemplary waveform diagram of an output of a first dummy stage shown in FIG. 5.

FIG. 6 is an exemplary waveform diagram of an output of a first dummy stage shown in FIG. 4, and FIG. 7 is an exemplary waveform diagram of an output of a first dummy stage shown in FIG. 5. FIG. 6 shows the first dummy carry signal Cr(dum1) when the second pull-down transistor NT7 is operated in response to the second dummy carry signal CR(dum2) and FIG. 7 shows the first dummy carry signal Cr(dum1) when the second pull-down transistor NT7-1 is operated in response to the N-th carry signal CR(n).

Referring to FIGS. 6 and 7, when the second pull-down transistor NT7 is operated in response to the second dummy carry signal Cr(dum2), a ripple of the first dummy carry signal Cr(dum1) is generated at about −5.6 volts. However, when the second pull-down transistor NT7-1 is operated in response to the N-th carry signal Cr(n), the ripple of the first dummy carry signal Cr(dum1) is generated at about −7.35 volts. Thus, when the control electrode of the second pull-down transistor NT7-1 is connected to the input terminal IN to which the N-th carry signal Cr(n) is applied, the first dummy stage Dum1 may stably output the first dummy carry signal Cr(dum1) during high ambient temperatures.

Figure 8:
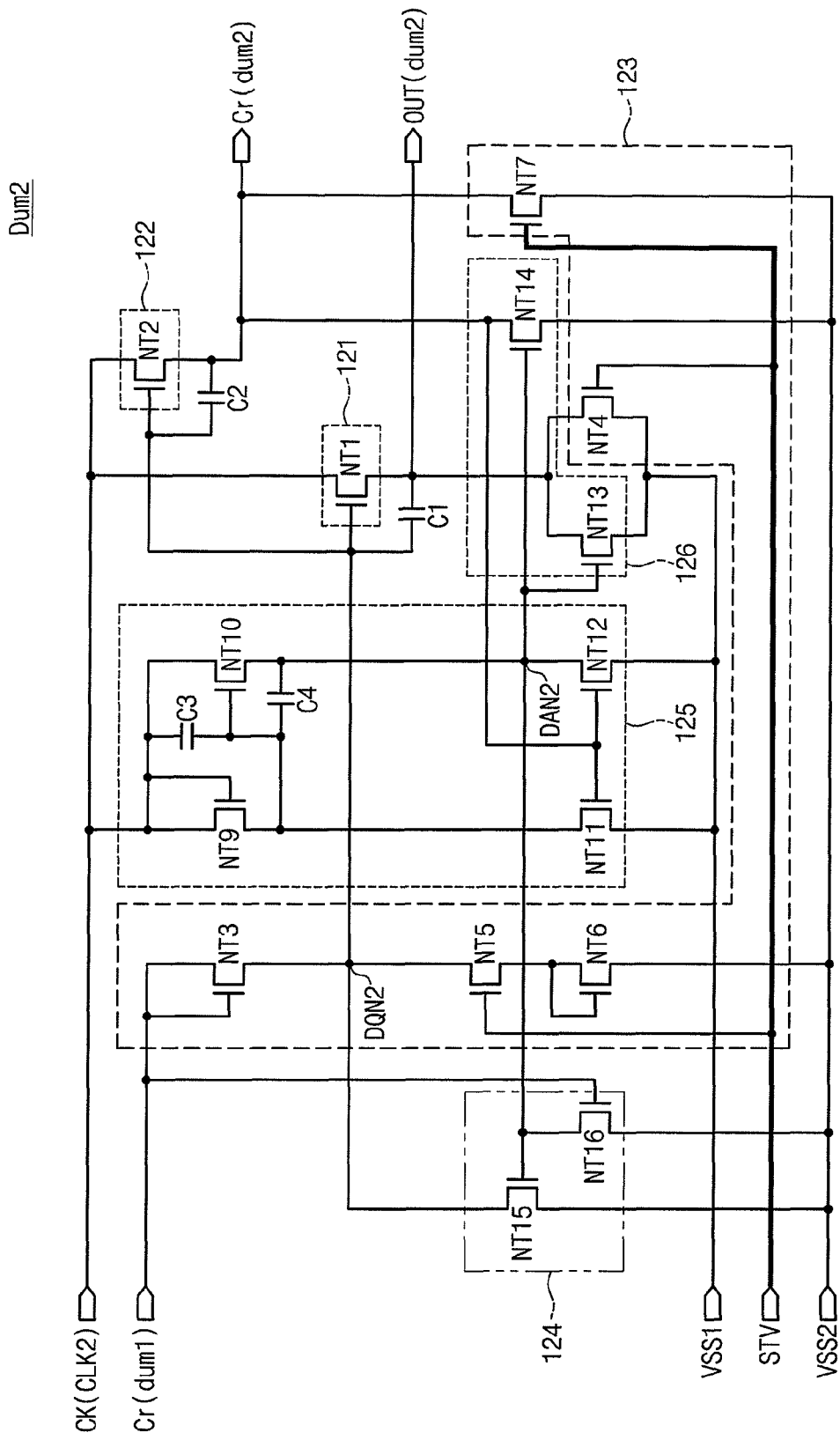
FIG. 8 is a circuit diagram showing a second dummy stage according to an exemplary embodiment of the present invention.

FIG. 8 is a circuit diagram showing a second dummy stage according to an exemplary embodiment of the present invention. Referring to FIG. 8, the second dummy stage Dum2 includes a fifth output part 121, a sixth output part 122, a second dummy control part 123, a second dummy inverter part 125, a third dummy holding part 126, and a second dummy stabilizing part 124.

The second dummy stage Dum2 has a similar circuit configuration to that of the first dummy stage Dum1 shown in FIG. 4, except that the second dummy stage Dum2 does not include the first dummy holding part 114 of FIG. 4. For example, since the second dummy stage Dum2 does not include the second control terminal CT2 as shown in FIG. 1B, the first dummy holding part 114 need not be provided within the second dummy stage Dum2.

The second dummy stage Dum2 receives the start signal STV through the first control terminal CT1. Accordingly, the second dummy control part 123 may discharge an electric potential of a second dummy Q-node DQN2 to the second voltage VSS2 in response to the start signal STV and hold the second dummy carry signal Cr(dum2) at the second voltage VSS2.

Except for the above mentioned circuit elements, the second dummy stage Dum2 has the same circuit configurations as those of the first dummy stage Dum1, and thus detailed descriptions of the same circuit configurations will be omitted.

Figure 9:
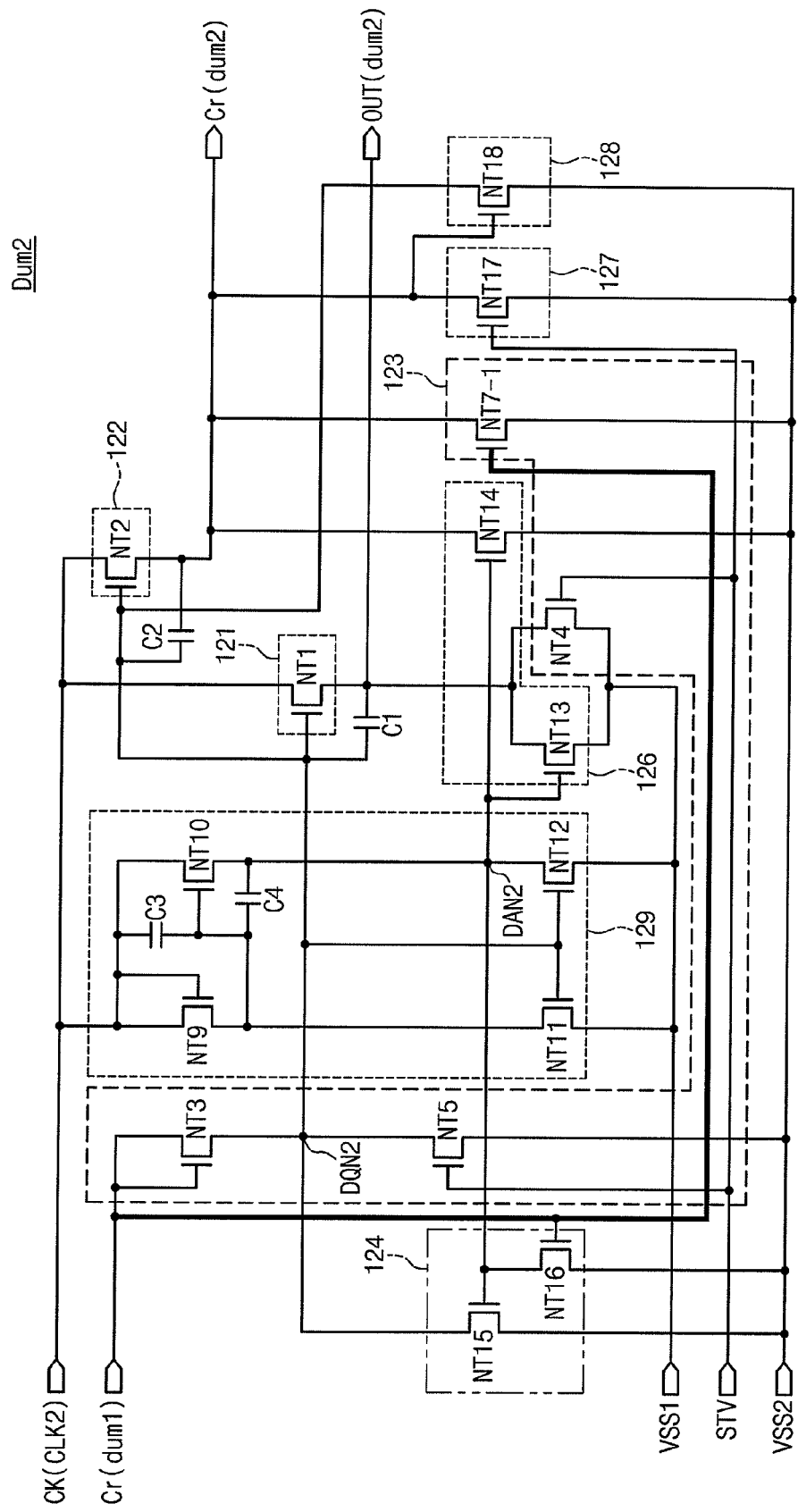
FIG. 9 is a circuit diagram showing a second dummy stage according to another exemplary embodiment of the present invention.

FIG. 9 is a circuit diagram showing a second dummy stage according to another exemplary embodiment of the present invention. In FIG. 9, the same reference numerals denote the same elements in FIG. 8, and thus detailed descriptions of the same elements will be omitted.

Referring to FIG. 9, a second dummy stage Dum2 includes a fifth output part 121, a sixth output part 122, a second dummy control part 123, a third dummy inverter part 129, a third dummy holding part 126, a second dummy stabilizing part 124, a fourth dummy holding part 127, and a reset part 128.

The third dummy inverter part 129 includes first, second, third, and fourth transistors NT9, NT10, NT11, and NT12, and third and fourth capacitors C3 and C4.

The first transistor NT9 includes an input electrode and a control electrode that receives the second clock signal CLK2, and an output electrode connected to the third transistor NT11. The second transistor NT10 includes an input electrode receiving the second clock signal CLK2, a control electrode connected to the output electrode of the first transistor NT9, and an output electrode connected to a second dummy A-node DAN2. The third capacitor C3 is connected between the input electrode and the control electrode of the second transistor NT10 and the fourth capacitor C4 is connected between the control electrode and the output electrode of the second transistor NT10.

The third transistor NT11 includes an input electrode connected to the output electrode of the first transistor NT9, a control electrode connected to the second dummy Q-node DQN2, and an output electrode connected to the first voltage input terminal V1 to which the first voltage VSS1 is applied. The fourth transistor NT12 includes an input electrode connected to the second dummy A-node DAN2, a control electrode connected to the second dummy Q-node DQN2, and an output electrode connected to the first voltage input terminal V1 to which the first voltage VSS1 is applied.

The third and fourth transistors NT11 and NT12 are turned on or off according to the electric potential of the second dummy Q-node DQN2. When the electric potential of the second dummy Q-node DQN2 is increased, the third and fourth transistors NT11 and BT12 are turned on, so that the electric potential of the second dummy A-node DAN2 is lowered by the turned-on third and fourth transistors NT11 and NT12. When the electric potential of the second dummy Q-node DQN2 is decreased, the third and fourth transistors NT11 and NT12 are turned off, so the electric potential of the second dummy A-node DAN2 is gradually increased by the turned-off third and fourth transistors NT11 and NT12.

When the electric potential of the second dummy A-node DAN2 is increased, the second and third holding transistors NT13 and NT14 are turned on. Thus, the second dummy gate signal OUT(dum2) and the second dummy carry signal Cr(dum2) may be held at the first and second voltages VSS1 and VSS2 by the turned-on second and third holding transistors NT13 and NT14, respectively.

The second dummy stage Dum2 may further include the fourth dummy holding part 127 and the reset part 128. The fourth dummy holding part 127 holds the second dummy carry signal Cr(dum2) at the second voltage VSS2 in response to the start signal STY. For example, the fourth dummy holding part 127 includes a fourth holding transistor NT17 including an input electrode connected to the carry terminal CR to receive the second dummy carry signal Cr(dum2), a control electrode connected to the first control terminal CT1 to receive the start signal STV, and an output electrode connected to the second voltage input terminal V2 to which the second voltage VSS2 is applied. Accordingly, when the start signal STV is generated at the logic high state, the fourth holding transistor NT17 is turned on and the second dummy carry signal Cr(dum2) may be lowered to the second voltage VSS2 by the turned-on fourth holding transistor NT17. Consequently, the second dummy carry signal Cr(dum2) may be discharged by the fourth holding transistor NT17.

The reset part 128 resets the electric potential of the second dummy Q-node DQN2 to the second voltage VSS2 in response to the second dummy carry signal Cr(dum2). For example, the reset part 128 includes a reset transistor NT18 including an input electrode connected to the second dummy Q-node DQN2, a control electrode connected to the carry terminal CR to receive the second dummy carry signal Cr(dum2), and an output electrode connected to the second voltage input terminal V2 to which the second voltage VSS2 is applied. Thus, when the second dummy carry signal Cr(dum2) transitions to the logic high state, the reset transistor NT18 is turned on, so the electric potential of the second dummy Q-node DQN2 may be lowered to the second voltage VSS2 by the turned-on reset transistor NT18.

The second dummy stage Dum2 may reset the electric potential of the second dummy Q-node DQN2 to the second voltage VSS2 lower than the first voltage VSS1 in response to the second dummy carry signal Cr(dum2). Accordingly, the third and fourth transistors NT11 and NT12 of the third dummy inverter part 129 may be prevented from being turned on, thereby ensuring a high-temperature driving margin of the second dummy stage Dum2.

Figure 10:
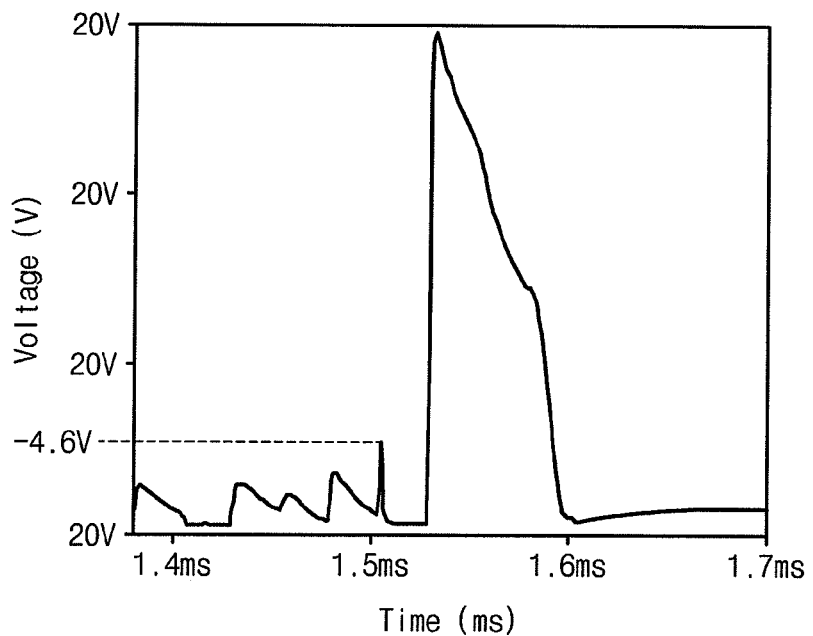
FIG. 10 is an exemplary waveform diagram of an output of a second dummy stage shown in FIG. 8.
Figure 11:
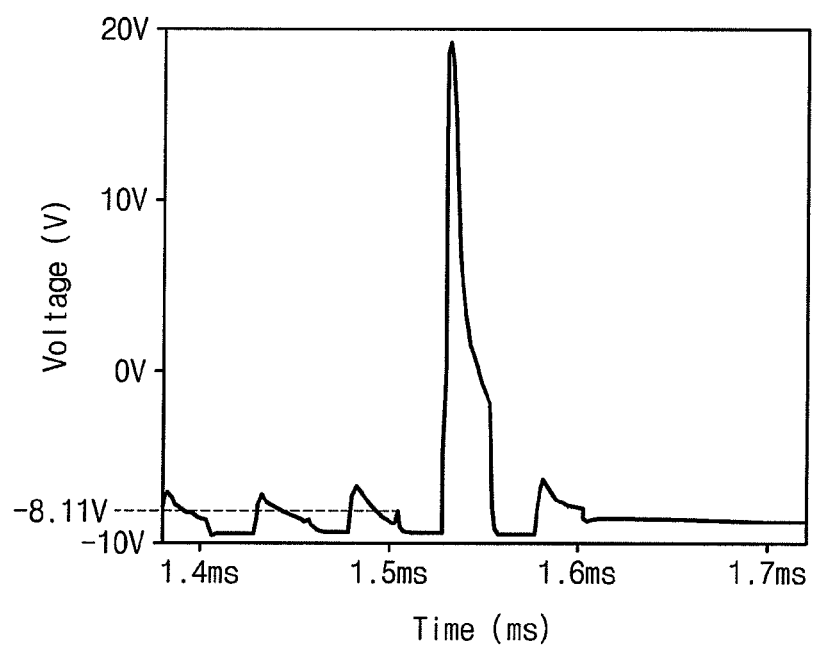
FIG. 11 is an exemplary waveform diagram of an output of a second dummy stage shown in FIG. 9.

FIG. 10 is an exemplary waveform diagram of an output of a second dummy stage shown in FIG. 8 and FIG. 11 is an exemplary waveform diagram of an output of a second dummy stage shown in FIG. 9. FIG. 10 shows the second dummy carry signal Cr(dum2) when the second pull-down transistor NT7 is operated in response to the start signal STV and FIG. 11 shows the second dummy carry signal Cr(dum2) when the second pull-down transistor NT7-1 is operated in response to the first dummy carry signal CR(dum1).

Referring to FIGS. 10 and 11, when the second pull-down transistor NT7 is operated in response to the start signal STV, a ripple of the second dummy carry signal Cr(dum1) is generated at about −4.6 volts. However, when the second pull-down transistor NT7 is operated in response to the first dummy carry signal Cr(dum1), the ripple of the second dummy carry signal Cr(dum2) is generated at about −8.11 volts. Thus, when the control electrode of the second pull-down transistor NT7-1 is connected to the input terminal IN to which the first dummy carry signal Cr(dum1) is applied, the second dummy stage Dum2 may stably output the second dummy carry signal Cr(dum2) during high ambient temperatures.

Figure 12:
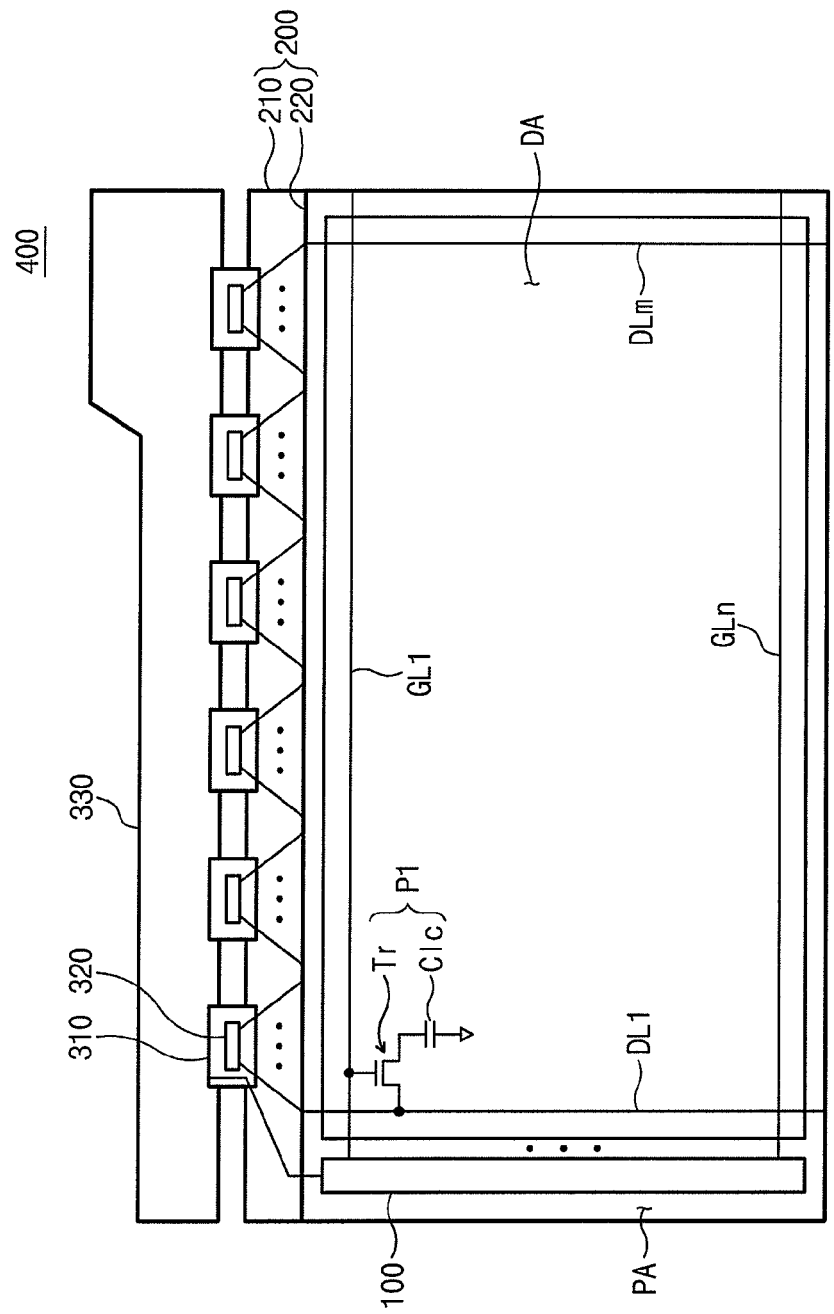
FIG. 12 is a plan view showing a display apparatus according to an exemplary embodiment of the present invention.

FIG. 12 is a plan view showing a display apparatus according to an exemplary embodiment of the present invention. Referring to FIG. 12, a display apparatus 400 includes a liquid crystal display panel 200 displaying an image, a plurality of data driving chips 320 outputting a data voltage to the liquid crystal display panel 200, and a gate driving circuit 100 outputting a gate signal to the liquid crystal display panel 200.

The liquid crystal display panel 200 includes a first substrate 210, a second substrate 220 facing the first substrate 210, and a liquid crystal layer (not shown) disposed between the first substrate 210 and the second substrate 220. The liquid crystal display panel 200 includes a display area DA in which the image is displayed and a peripheral area PA adjacent the display area DA.

Gate lines GL1 to GLn and data lines DL1 to DLm insulated from the gate lines GL1 to GLn while crossing the gate lines GL1 to GLn, are arranged in the display area DA. In addition, pixels P1 are arranged in the pixel area DA and each pixel P1 includes a thin film transistor Tr and a liquid crystal capacitor Clc. As an example, the thin film transistor Tr includes a gate electrode connected to a corresponding gate line of the gate lines GL1 to GLn, a source electrode connected to a corresponding data line of the data lines DL1 to DLm, and a drain electrode connected to a pixel electrode that serves as a first electrode of the liquid crystal capacitor Clc.

The gate driving circuit 100 is arranged in the peripheral area PA adjacent to one end of the gate lines GL1 to GLn. The gate driving circuit 100 is electrically connected to ends of the gate lines GL1 to GLn and sequentially applies the gate signal to the gate lines GL1 to GLn.

In an exemplary embodiment of the present invention, the gate driving circuit has a circuit configuration described by one or more of FIGS. 1 to 9, and thus a detailed description of the gate driving circuit 100 will be omitted.

In at least one exemplary embodiment of the present invention, the gate driving circuit 100 is directly formed on the peripheral area PA of the first substrate 210 through a thin film process applied to form the pixels P1 on the first substrate 210. When the gate driving circuit 100 is integrated on the first substrate 210, the driving chips in which the gate driving circuit 100 is located may be removed from the display apparatus 400, thereby improving productivity of the display apparatus and reducing the size of the display apparatus 400.

A plurality of tape carrier packages 310 are attached to the peripheral area PA adjacent one end of the data lines DL1 to DLm. A plurality of data driving chips 320 are mounted on the tape carrier packages 310 in a one-to-one correspondence. The data driving chips 320 are electrically connected to the data lines DL1 to DLm and output the data voltage to the data lines DL1 to DLm.

The display apparatus 400 may further include a printed circuit board 330 to control the driving of the gate driving circuit 100 and the data driving chips 320. The printed circuit board 330 outputs a data control signal to control the driving of the data driving chips 320 and display of image data, and outputs a gate control signal to control the driving of the gate driving circuit 100. The data driving chips 320 receive the image data in synchronization with the data control signal, convert the image data to the data voltage, and output the data voltage. The gate driving circuit 100 receives the gate control signal through the tape carrier packages 310 and sequentially outputs gate signals in response to the gate control signal.

The liquid crystal display panel 200 charges a liquid crystal capacitor Clc with a data voltage when a thin film transistor Tr is turned on in response to a gate signal. As a result, the liquid crystal display panel 200 may control the transmittance of the liquid crystal layer and display the desired images.

FIG. 13 is a plan view showing a display apparatus according to another exemplary embodiment of the present invention. Referring to FIG. 13, a display apparatus 410 has a structure in which the data driving chips 320 shown in FIG. 12 are integrated in a single driving chip 340. A gate driving circuit 100 is arranged in a first peripheral area PA1 of a first substrate 210 of a liquid crystal display panel 200 and the driving chip 340 is arranged in a second peripheral area PA2.

The display apparatus 410 may further include a flexible printed circuit board 350 to connect the driving chip 340 to a printed circuit board 360. Accordingly, control signals output from the printed circuit board 360 may be applied to the driving chip 340 and the gate driving circuit 100 through the flexible printed circuit board 350.

The gate driving circuits shown in FIGS. 1 to 9 may be employed in various display apparatuses other than the above-mentioned display apparatus.

While exemplary embodiments of the present invention have been described, it is to be understood that the present invention is not limited to these exemplary embodiments, and various changes and modifications can be made by one ordinary skilled in the art within the spirit and scope of the disclosure.

What is claimed is:

1. A driving circuit comprising:
a plurality of stages driven in response to a start signal, wherein the stages include at least two normal stages, a first dummy stage, and a second dummy stage, wherein each normal stage comprises:
a first output part that outputs a gate signal according to an electric potential of a node of the normal stage;
a second output part that outputs a carry signal according to the electric potential of the node;
a control part comprising:
a buffer part that increases the electric potential of the node in response to a previous carry signal output from a previous one of the stages,
a first pull-down part that decreases the gate signal to a first voltage in response to a first next carry signal output from a first next one of the stages, and
a second pull-down part that decreases the carry signal to a second voltage lower than the first voltage in response to the first next carry signal; and
a holding part applies the second voltage to the node in response to receipt of a second next carry signal output from a second next one of the stages,
wherein the first dummy stage outputs a first dummy carry signal to the last two normal stages in response to receipt of a last carry signal from the last normal stage and the start signal, and wherein the second dummy stage outputs a second dummy carry signal to the last normal stage in response to receipt of the first dummy carry signal and the start signal.

2. The driving circuit of claim 1, wherein the first dummy stage comprises:
a first dummy output part that outputs a first dummy gate signal according to an electric potential of a first dummy node of the first dummy stage;
a second dummy output part that outputs the first dummy carry signal according to the electric potential of the first dummy node;
a first dummy control part that increases the electric potential of the first dummy node in response to the last carry signal and decreases the first dummy gate signal to the first voltage in response to the second dummy carry signal; and
a first dummy holding part that receives the start signal and applies the second voltage to the first dummy node.

3. The driving circuit of claim 2, wherein the first dummy control part comprises:
a buffer part that increases the electric potential of the first dummy node in response to the last carry signal;
a first pull-down part that decreases the first dummy gate signal to the first voltage in response to the second dummy carry signal; and
a discharge part that decreases the electric potential of the first dummy node to the second voltage in response to the second dummy carry signal.

4. The driving circuit of claim 3, wherein the first dummy control part further comprises a second pull-down part to decrease the first dummy carry signal to the second voltage in response to the second dummy carry signal.

5. The driving circuit of claim 3, wherein the first dummy control part further comprises a second pull-down part to decrease the first dummy carry signal to the second voltage in response to the last carry signal.

6. The driving circuit of claim 2, wherein the first dummy stage further comprises:
a first dummy inverter part that outputs a clock signal to a second dummy node of the first dummy stage in response to the first dummy carry signal; and
a second dummy holding part that holds the dummy gate signal and the first dummy carry signal at the first voltage according to the electric potential of the second dummy node.

7. The driving circuit of claim 6, wherein the first dummy stage further comprises:
a first dummy stabilizing part that holds the electric potential of the first dummy node at the second voltage according to the electric potential of the second dummy node; and
a second dummy stabilizing part that holds the electric potential of the first dummy node at the second voltage according to the last carry signal.

8. The driving circuit of claim 1, wherein the second dummy stage comprises:
a first dummy output part that outputs a first dummy gate signal according to an electric potential of a first dummy node of the second dummy stage;
a second dummy output part that outputs the second dummy carry signal according to the electric potential of the first dummy node; and
a first dummy control part that increases the electric potential of the first dummy node in response to the first dummy carry signal and decreases the first dummy gate signal to the first voltage in response to the start signal.

9. The driving circuit of claim 8, wherein the first dummy control part comprises:
a buffer part that increases the electric potential of the first dummy node in response to the last carry signal;
a first pull-down part that decreases the first dummy gate signal to the first voltage in response to the second dummy carry signal;
a discharge part that discharges the electric potential of the first dummy node to the second voltage in response to the second dummy carry signal; and
a second pull-down part that decreases the first dummy carry signal to the second voltage in response to the previous carry signal.

10. The driving circuit of claim 8, wherein the second dummy stage further comprises:
a first dummy inverter part that outputs a clock signal to a second dummy node of the second dummy stage in response to the second dummy carry signal; and
a first dummy holding part that holds the first dummy gate signal and the second dummy carry signal at the first voltage according to the electric potential of the second dummy node.

11. The driving circuit of claim 8, wherein the second dummy stage further comprises:
a first dummy inverter part that outputs a clock signal to a second dummy node of the second dummy stage according to the electric potential of the first dummy node;
a first dummy holding part that holds the first dummy gate signal and the second dummy carry signal at the first voltage according to the electric potential of the second dummy node; and
a second dummy holding part that holds the second dummy carry signal at the second voltage in response to the start signal.

12. The driving circuit of claim 11, wherein the second dummy stage further comprises a reset part that resets the electric potential of the first dummy node to the second voltage in response to the second dummy carry signal.

13. The driving circuit of claim 11, wherein the second dummy stage comprises:
a first dummy stabilizing part that holds the electric potential of the first dummy node at the second voltage according to the electric potential of the second dummy node; and
a second dummy stabilizing part that holds the electric potential of the second dummy node at the second voltage in response to the first dummy carry signal.

14. The driving circuit of claim 1, wherein the control part comprises:
a buffer part that increases the electric potential of the node in response to the previous carry signal;
a first pull-down part that decreases the gate signal to the first voltage in response to the first next carry signal;
a discharge part that discharges the electric potential of the node in response to the first next carry signal; and
a second pull-down part that decreases the carry signal to the second voltage in response to the first next carry signal.

15. The driving circuit of claim 14, wherein each stage further comprises:
an inverter part that outputs a clock signal to a second node of the stage in response to the carry signal; and
a second holding part that holds the gate signal and the carry signal at the first voltage according to the electric potential of the second node.

16. The driving circuit of claim 15, wherein each stage further comprises:

a first stabilizing part that holds the electric potential of the node at the second voltage according to the electric potential of the second node; and a second stabilizing part that holds the electric potential of the second node at the second voltage in response to the previous carry signal.

17. A gate driving circuit for a display apparatus, the gate driving circuit comprising:

at least two normal stages, a first dummy stage, and a second dummy stage, wherein each stage outputs a carry signal to a next one of the stages, wherein the first dummy stage receives a last carry signal from the last normal stage to generate a first dummy carry signal, wherein the second dummy stage receives the first dummy carry signal from the first dummy stage to generate a second dummy carry signal, wherein the last normal stage receives the first dummy carry signal from the first dummy stage and the second carry signal from the second dummy stage to generate a last carry signal, wherein each of the normal stages decreases a gate signal to a first voltage in response to a first next carry signal output from a first next one of the stages, decreases the carry signal to a second voltage lower than the first voltage in response to the first next carry signal, and applies the second voltage to a node therein in response to a second next carry signal output from a second next one of the stages.

18. The gate driving circuit of claim 17, wherein the first dummy stage outputs the first dummy carry signal to the last two normal stages in response to the receipt of the last carry signal and a start signal, and wherein the second dummy stage outputs the second dummy carry signal to the last normal stage in response to receipt of the first dummy carry signal and the start signal.

19. The gate driving circuit of claim 18, wherein the normal stage preceding the last normal stage receives the last carry signal from the last normal stage and the first dummy carry signal from the first dummy stage.

20. A gate driving circuit for a display apparatus, the gate driving circuit comprising:

a plurality of stages driven in response to a start signal, wherein the stages include at least two normal stages, a first dummy stage, and a second dummy stage, wherein each normal stage comprises:

a control part that increases a electric potential of a node within the normal stage in response to a previous carry signal output from a previous one of the stages, decreases a gate signal output by the normal stage to a first voltage in response to a first next carry signal output from a first next one of the stages, and decreases a carry signal to a second voltage lower than the first voltage in response to the first next carry signal; and a holding part that applies the second voltage to the node in response to receipt of a second next carry signal output from a second next one of the stages and, wherein the first dummy stage outputs a first dummy carry signal to the last two normal stages in response to a last carry signal from the last normal stage and the start signal, and wherein the second dummy stage outputs a second dummy carry signal to the last normal stage in response to the first dummy carry signal and the start signal.

* * * * *